United States Patent
Tützauer et al.

(10) Patent No.: US 10,718,729 B2
(45) Date of Patent: Jul. 21, 2020

(54) DEVICE FOR DETECTING FAULTS IN RAILS BY MEASURING IMPEDANCE

(71) Applicant: Metrolab, Paris (FR)

(72) Inventors: René Tützauer, Paris (FR); Jacques Pore, Saint Ouen (FR); Marc Burier, Fontenay-Sous-Bois (FR); Aurélie Pornin, Saint Ouen (FR); Frédéric Lalloyer, Fretin (FR); Hervé Collard, Monchaux sur Ecaillon (FR)

(73) Assignee: METROLAB, Paris (FR)

( * ) Notice: Subject to any disclaimer, the term of this patent is extended or adjusted under 35 U.S.C. 154(b) by 0 days.

(21) Appl. No.: 15/547,498

(22) PCT Filed: Jun. 8, 2015

(86) PCT No.: PCT/EP2015/062717
§ 371 (c)(1),
(2) Date: Jul. 30, 2017

(87) PCT Pub. No.: WO2015/118185
PCT Pub. Date: Aug. 13, 2015

(65) Prior Publication Data
US 2018/0052127 A1  Feb. 22, 2018

(30) Foreign Application Priority Data
Feb. 13, 2015 (FR) ..................... 15 51217

(51) Int. Cl.
*G01R 27/28* (2006.01)
*G01N 27/02* (2006.01)
(Continued)

(52) U.S. Cl.
CPC ............. *G01N 27/028* (2013.01); *B61K 9/08* (2013.01); *B61L 3/002* (2013.01); *B61L 23/042* (2013.01);
(Continued)

(58) Field of Classification Search
CPC ........ G01R 27/26; G01L 21/30; G01N 27/62; G01N 27/64; H01J 41/00; H01J 41/02
(Continued)

(56) References Cited

U.S. PATENT DOCUMENTS 1,804,380 A   5/1931  Sperry
1,983,442 A  12/1934  Drake
(Continued)

FOREIGN PATENT DOCUMENTS

DE  10 2013 219763 A1   8/2014
EP      2 386 455 A1    11/2011

OTHER PUBLICATIONS

PCT Patent Application No. PCT/EP2015/062717, Rapport de Recherche Internationale, Oct. 14, 2015, 3 pages.
(Continued)

*Primary Examiner* — Raul J Rios Russo
(74) *Attorney, Agent, or Firm* — Soquel Group LLC

(57) ABSTRACT

An electrical detection device carried by a rail vehicle traveling on a railway track to detect faults in at least one rail, including a contact support suitable for being mechanically linked to the rail vehicle, at least one reference contact and corresponding measuring contact applied to a rail, and carried by the support, a processing circuit to which each reference contact and measuring contact are connected, suitable for measuring the impedance between the corresponding reference and measuring contacts, means for positioning the contact support facing the surface of the rail in a measurement direction corresponding to the axis of the rail, such that each first reference contact and each corresponding measuring contact relate to the same rail, and at least two measuring contacts transversely offset relative to the measurement direction, wherein the processing circuit
(Continued)

includes means for measuring the impedance between at least one reference contact and each measuring contact.

11 Claims, 7 Drawing Sheets

(51) Int. Cl.

| | | |
|---|---|---|
| *B61K 9/08* | (2006.01) | |
| *G01N 27/20* | (2006.01) | |
| *B61L 23/04* | (2006.01) | |
| *G01R 27/26* | (2006.01) | |
| *G01L 21/30* | (2006.01) | |
| *G01N 27/62* | (2006.01) | |
| *G01N 27/64* | (2006.01) | |
| *B61L 3/00* | (2006.01) | |
| *B61L 25/02* | (2006.01) | |
| *H01J 41/00* | (2006.01) | |
| *H01J 41/02* | (2006.01) | |

(52) U.S. Cl.
CPC .......... *B61L 23/044* (2013.01); *B61L 23/045* (2013.01); *B61L 25/02* (2013.01); *G01L 21/30* (2013.01); *G01N 27/20* (2013.01); *G01N 27/62* (2013.01); *G01N 27/64* (2013.01); *G01R 27/26* (2013.01); *H01J 41/00* (2013.01); *H01J 41/02* (2013.01)

(58) Field of Classification Search
USPC .................. 324/76.11–76.83, 459, 600, 649
See application file for complete search history.

(56) References Cited

U.S. PATENT DOCUMENTS

| | | | | |
|---|---|---|---|---|
| 2,095,911 | A | | 10/1937 | Billstein et al. |
| 4,145,018 | A | * | 3/1979 | Poggio .................. B61L 23/044 246/34 D |
| 4,351,504 | A | * | 9/1982 | Frielinghaus ........... B61L 1/165 246/122 R |
| 4,775,103 | A | * | 10/1988 | Ortwein .................... E01B 9/60 238/149 |
| 4,785,589 | A | * | 11/1988 | Buhler .................... E01B 31/17 451/28 |
| 5,242,136 | A | * | 9/1993 | Cribbens ................. B61L 1/183 246/187 R |
| 2007/0163352 | A1 | * | 7/2007 | Nielsen .................... B61K 9/10 73/668 |
| 2010/0102643 | A1 | * | 4/2010 | Gaudenz .................. B60L 3/00 307/326 |
| 2014/0129154 | A1 | | 5/2014 | Cooper et al. |
| 2014/0138493 | A1 | | 5/2014 | Noffsinger et al. |
| 2014/0207317 | A1 | | 7/2014 | Noffsinger et al. |
| 2015/0367872 | A1 | * | 12/2015 | Plotnikov ................. B61L 3/18 246/121 |
| 2016/0075356 | A1 | * | 3/2016 | Kull ...................... B61L 23/044 246/121 |
| 2016/0090113 | A1 | * | 3/2016 | Nagrodsky ............. B61L 23/04 246/34 R |
| 2016/0194012 | A1 | * | 7/2016 | Matthews ................. B61L 3/10 246/121 |
| 2018/0065650 | A1 | * | 3/2018 | Plotnikov ................. B61L 3/08 |

OTHER PUBLICATIONS

FR Patent Application No. 1551217, INPI Rapport de Recherche Préliminaire, Sep. 30, 2015, 3 pages.

* cited by examiner

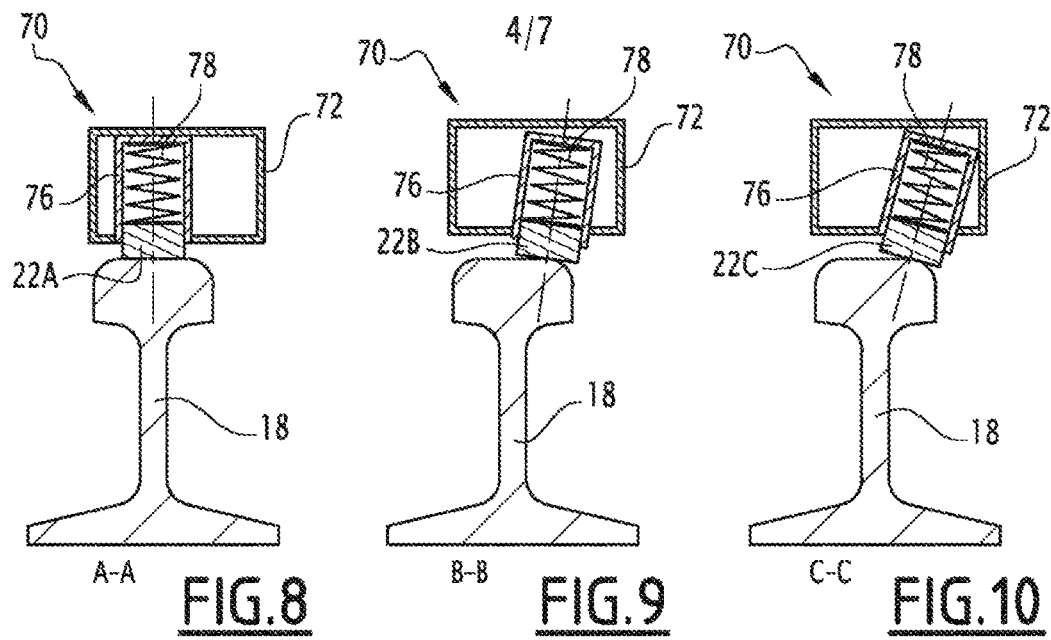
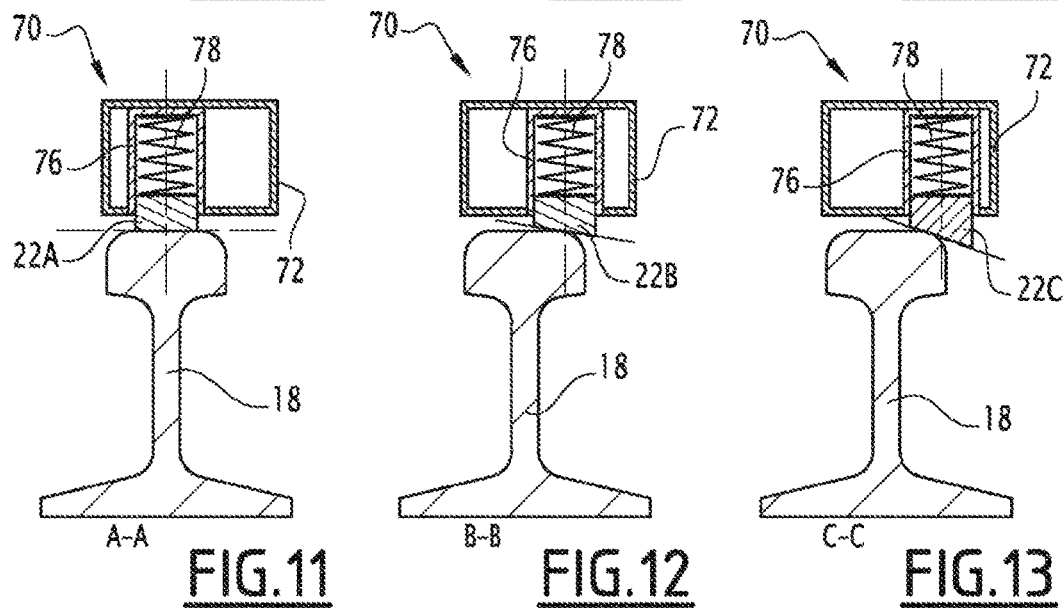
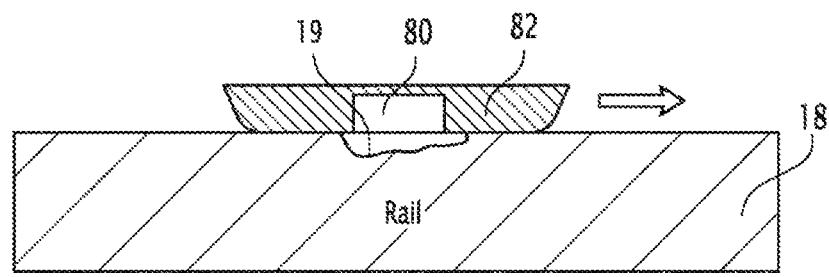

DEVICE FOR DETECTING FAULTS IN RAILS BY MEASURING IMPEDANCE

The present invention relates to an electrical detection device intended to be carried by a rail vehicle traveling on rails constituting a railway track and making it possible to detect faults in at least one rail, said detection device comprising:
- a contact support suitable for being mechanically linked to the rail vehicle;
- at least one reference contact and at least one corresponding measuring contact suitable for being applied to a rail, and carried by the support;
- a processing circuit to which the or each reference contact and the or each measuring contact are connected, suitable for measuring the impedance between the corresponding reference and measuring contacts.

The rails making up railway tracks are subject to significant mechanical stresses during their operational use in particular due to the repeated passage of trains, corrosion due to the environment, such that such rails may, over time, have structural faults, or even fracture.

Such faults on rails may lead to major operating difficulties for railway traffic or create more serious consequences, such as accidents, for example derailments.

In order to protect against such inconveniences, preventive maintenance is generally done on the rails of railway tracks so as to allow early detection of any such faults that they may have. Such preventive maintenance is done using various means, ranging from a simple observation by the conductors of railway vehicles or inspectors on foot, to the use of devices on-board dedicated inspection trains, of the optical or laser type, including the use of electrical circuits installed on the tracks.

One rail fault detection technique with good results is done by measuring the impedance of the rails. Indeed, the rails of railway tracks are made from electrically conductive materials, generally steel and its byproducts, such that they can be considered an electric dipole, and which consequently have an electrical impedance.

A rail therefore has an electrical impedance that depends on the structure of the rail, and in particular its cross-section.

In fact, the presence of a fault on a rail results in modifying the electrical impedance of this rail.

In the state of the art, railway vehicles exist provided with systems using the impedance measuring technique to detect the faults present in rails.

For example, document U.S. Pat. No. 4,979,392 describes a railway vehicle comprising a rail fault detection device using the impedance measuring technique. This detection device is pulled on the rails by the moving railway vehicle, and is able to determine, at each moment, the impedance of the rail portion belonging to the measuring circuit.

The detection device as it is described in this document is intended to be applied on the two rails making up a railway track on which the railway vehicle is traveling. Thus, this device is able to measure, at a given moment, the impedance of the portion of the two rails situated between the end of the railway vehicle and the detection device.

A railway vehicle provided with such a detection device is not fully satisfactory. Indeed, the electrical impedance measured by the detection device does not make it possible to characterize a fault, but only to detect the existence of a fracture on one of the two rails.

One aim of the invention is to provide a device for detecting a rail fault by measuring the impedance allowing a precise characterization of the fault.

To that end, the invention relates to a device of the aforementioned type, characterized in that:
- it comprises means for positioning the contact support facing the surface of the rail in a measurement direction corresponding to the axis of the rail, such that the or each first reference contact and the or each corresponding measuring contact relate to the same rail;
- it comprises at least two measuring contacts transversely offset relative to the measurement direction; and
- the processing circuit comprises means for measuring the impedance between at least one reference contact and each measuring contact.

The present invention comprises all of the elements necessary for an automated and precise characterization of the surface faults of the rail. It thus makes it possible to decrease the need for human intervention. The detection and characterization of surface faults of the rail is done in a single device. This device can be mounted on all types of trains circulating on the line, thus allowing quasi-permanent and automatic monitoring of the rails, to anticipate upgrade operations. The likelihood of rail fractures is very significantly reduced. The device is also capable of detecting clean fractures of the rail having developed too quickly to be recognized in time, to allow the operation to be secured immediately until the rail is repaired.

The detection device according to the invention may comprise one or more of the following features, considered alone or according to any technically possible combinations:
- the numbers of reference contacts and measuring contacts are different;
- said device comprises means for applying contacts on the rail according to different application angles from one another in the plane transverse to the length of the rail;
- the contact support is able to be pressed on the surface of the rail and carries several contacts electrically isolated from one another and elastically charged away from the support carrying each contact element;
- the contacts of a same support are connected to one another to form an articulated chain, retained at its ends to the support and extending transversely to the measuring direction;
- said device comprises several adjacent strips isolated from one another, each forming a contact, said strips being guided to slide relative to one another;
- the support comprising a bearing surface on a lateral flank of the rail and the device comprises lateral stressing means of the support to keep the bearing surface in contact with the lateral flank of the rail;
- said device comprises a system for locating the vehicle and means for correlating measurements with the position of the vehicle at the time of the measurement;
- said device comprises means for characterizing faults from at least two impedance characteristics measured by the at least two measuring contacts;
- the or each contact comprises a beveled shape at each of its ends.

The invention further relates to a vehicle comprising wheels capable of rolling on the railway track, characterized in that it comprises a device as previously defined above and the or each corresponding reference and/or measuring contact are arranged between two immediately successive wheels supporting the car.

It also relates to a measuring machine comprising an automated and/or remotely controlled self-propelled wagon able to follow at least one line of rails and a device as previously defined, secured to the self-propelled wagon.

The invention lastly relates to a method for detecting faults carried by rails making up a railway track, characterized in that it comprises the step of measuring the impedance of the rail between at least one reference contact and at least two measuring contacts offset transversely relative to the main direction of the rail, the contacts circulating along the length of the rail.

According to specific embodiments, the method sets out:
the movement of the device along the rails is done at the normal operating speed of a train, and
the analysis of the measurements provided by the measuring contacts is done in real time.

The invention will be better understood using the following description, provided solely as an example and done in reference to the appended drawings, in which.

Figure 7:
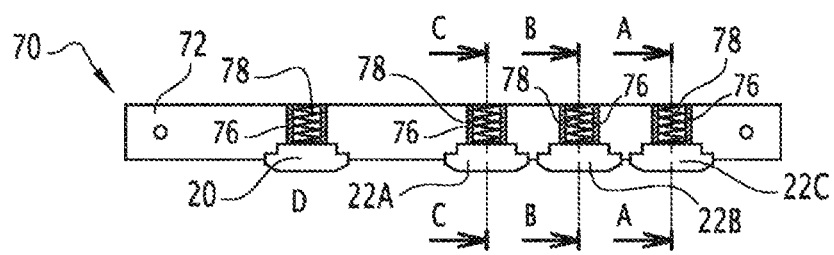
Figure 15:
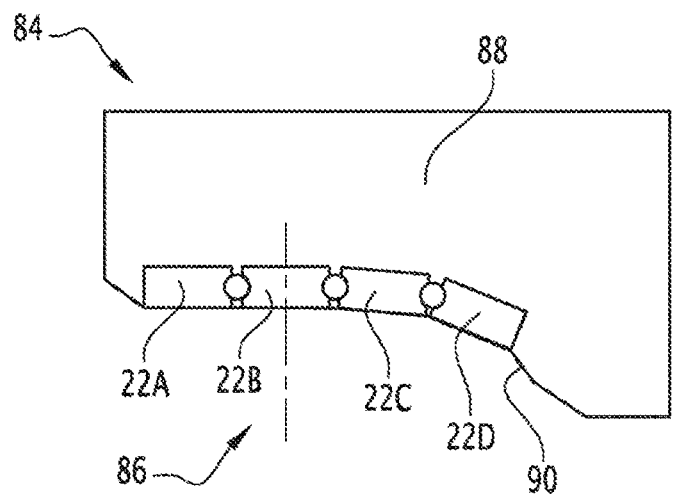
Figure 16:
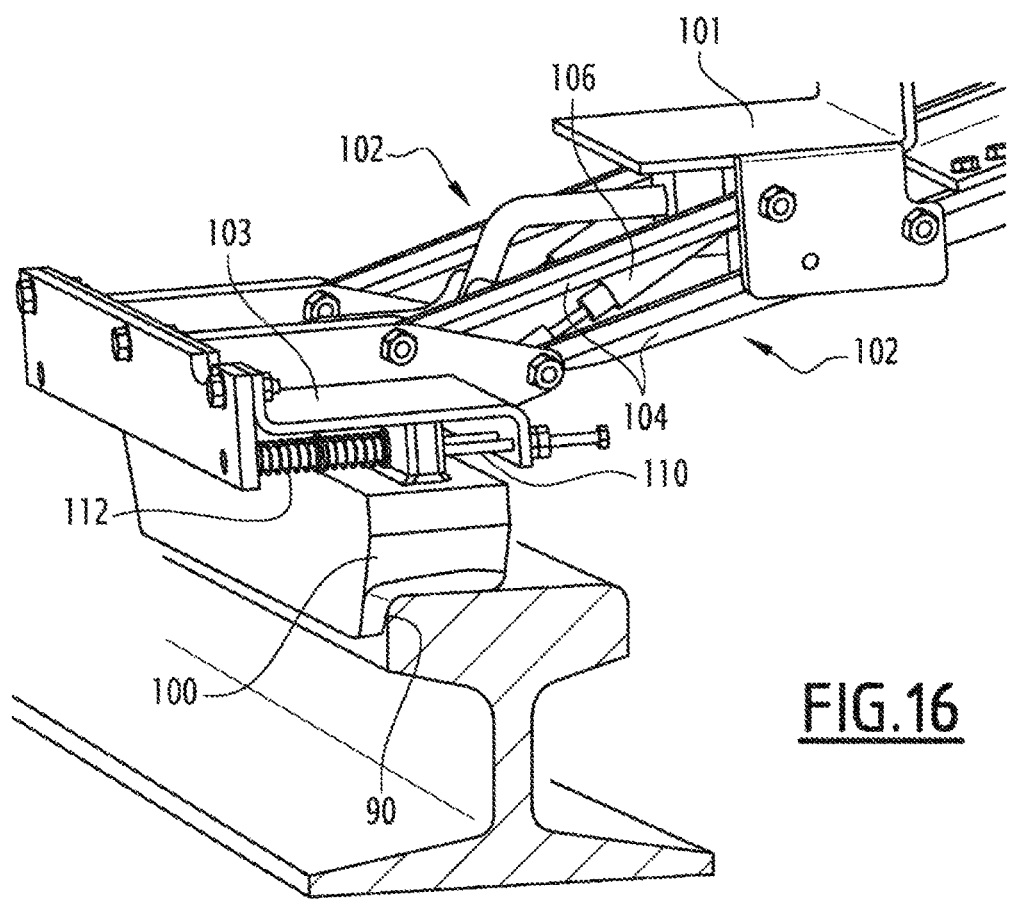
Figure 17:
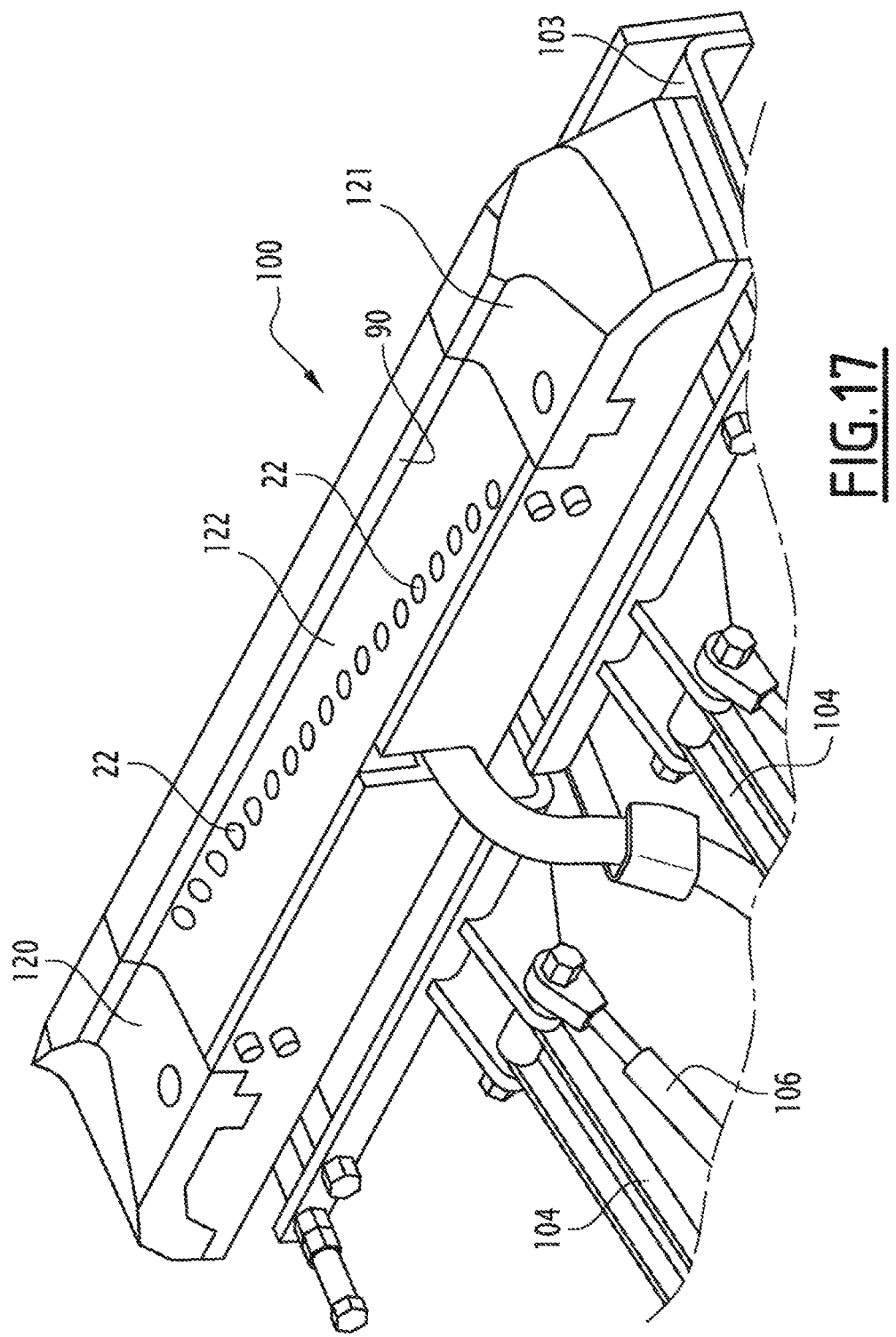
Figure 18:
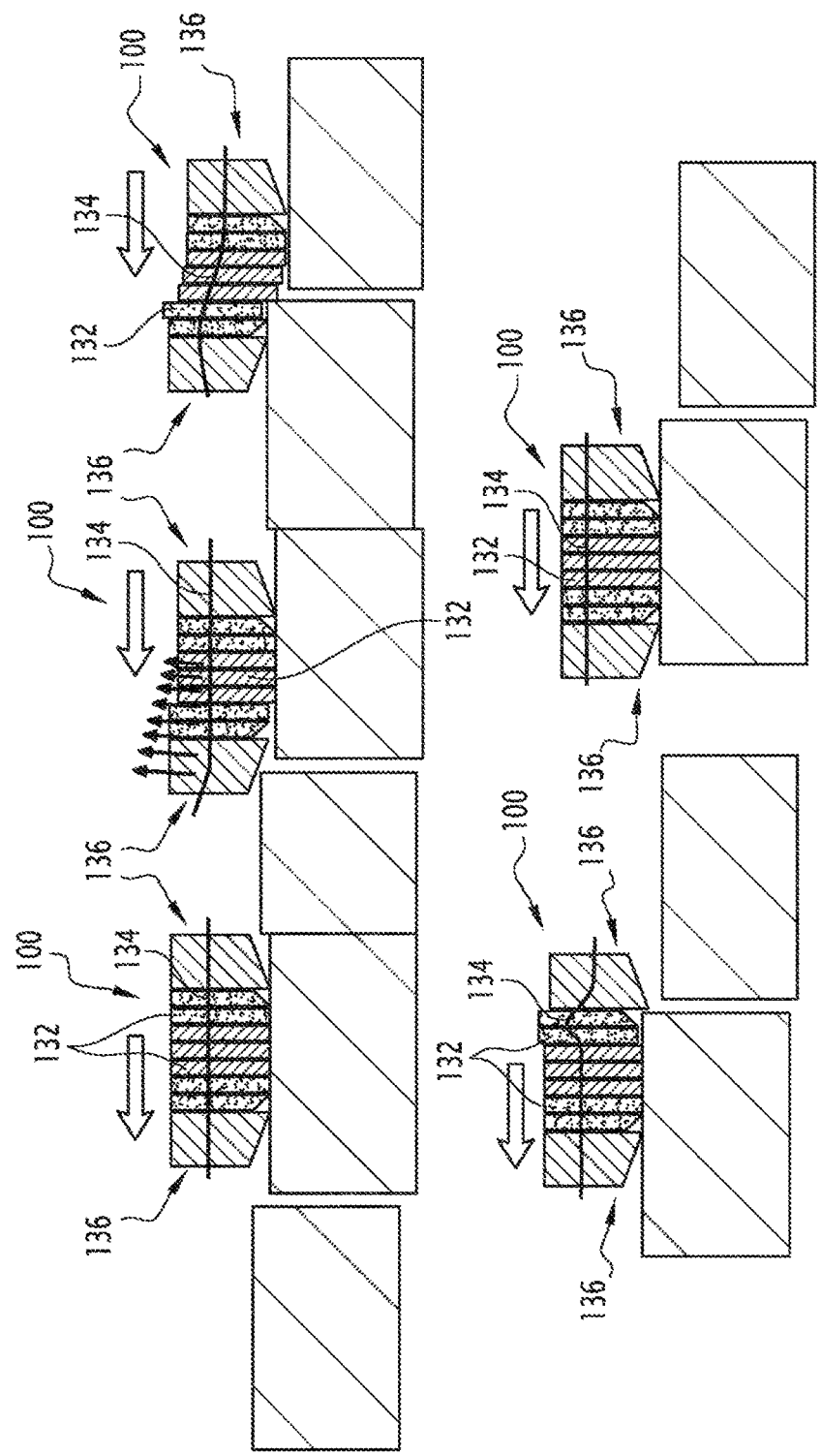

FIGS. 8-10 on the one hand and FIGS. 11-13 on the other hand are sectional views along planes A-A, B-B and C-C, respectively, of two embodiments of the arrangement of the contact elements of FIG. 7;

FIG. 14 is a sectional view of a contact according to one embodiment;

FIG. 15 is a sectional view of a measuring pad comprising several contacts articulated to one another;

FIG. 16 is a three-quarters perspective top view of a measuring pad according to still another embodiment in contact with the rail;

FIG. 17 is a three-quarters perspective bottom view of the measuring pad of FIG. 16; and FIG. 18 is a sectional view of an alternative embodiment of contacts of a measuring pad in several positions.

Figure 1:
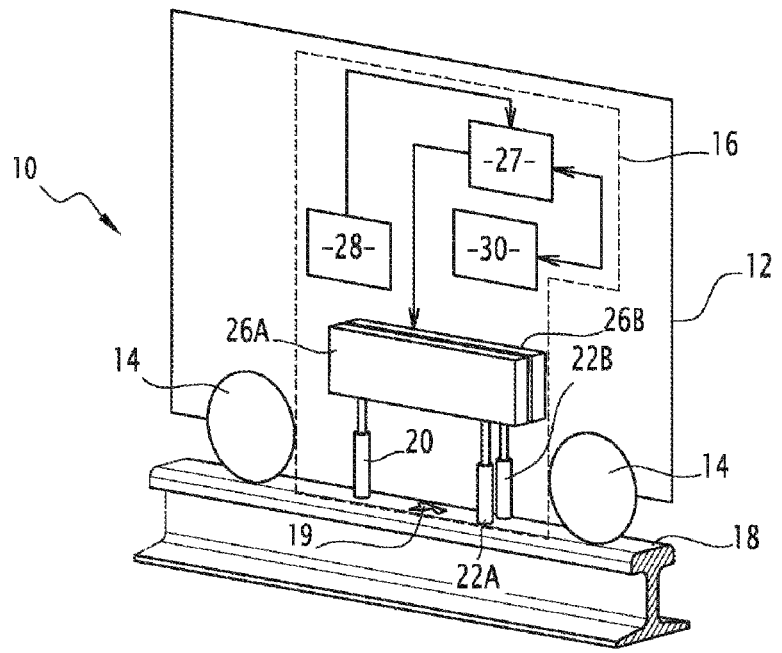
FIG. 1 is a schematic view of a railway vehicle provided with a fault detection device arranged on rails.

As shown in FIG. 1, a railway vehicle 10 comprises at least one car 12 carried by wheels 14 and at least one electrical fault detection device 16 carried by a single rail 18 of the track on which the vehicle is circulating.

The electrical detection device 16 is secured to the car 12 of the railway vehicle 10, and advantageously is situated partially in the body of the railway vehicle and on the support bogie.

The detection device 16 establishes an electrical measuring current comprising the rail.

Such an electrical detection device 16 is able to detect faults 19 carried by the rail 18 using the impedance measuring technique as described below.

The electrical detection device 16 comprises at least one reference contact 20 and at least two measuring contacts 22A, 22B also on the width of the rail, as well as a number of processing blocks 26A, 26B, ..., equal to the number of measuring contacts 22A, 22B, to which they are connected. It comprises a control and analysis unit 27, a geolocation module 28 for the measurement location of the impedance, and a memory 30.

The reference contact 20 is an electrical contact supplying a reference potential shared by all of the processing blocks 26A, 26B.

The contacts 20 and 22A, 22B are able to bear on the same rail 18 at a distance from one another and slide over its upper surface or optionally side surface during the advance of the vehicle. The reference contact 20 on the one hand and the measuring contacts 22A, 22B on the other hand are positioned in successive longitudinal positions along the direction of advance making up the measuring direction. Alternatively, they are positioned side by side along a same section of the rail. The measuring contacts 22A, 22B are spaced apart from one another by at least one 1 cm. The reference 20 and measuring contacts 22A, 22B are preferably carried by a same bogie and are arranged such that no wheel is situated between them.

The measuring contacts 22A, 22B are offset transversely relative to the measuring direction, i.e., they are in different locations projected over the section of the rail along the measuring direction, so as to be able to locate faults in a differentiated manner based on their position on the surface of the rail.

Figure 2:
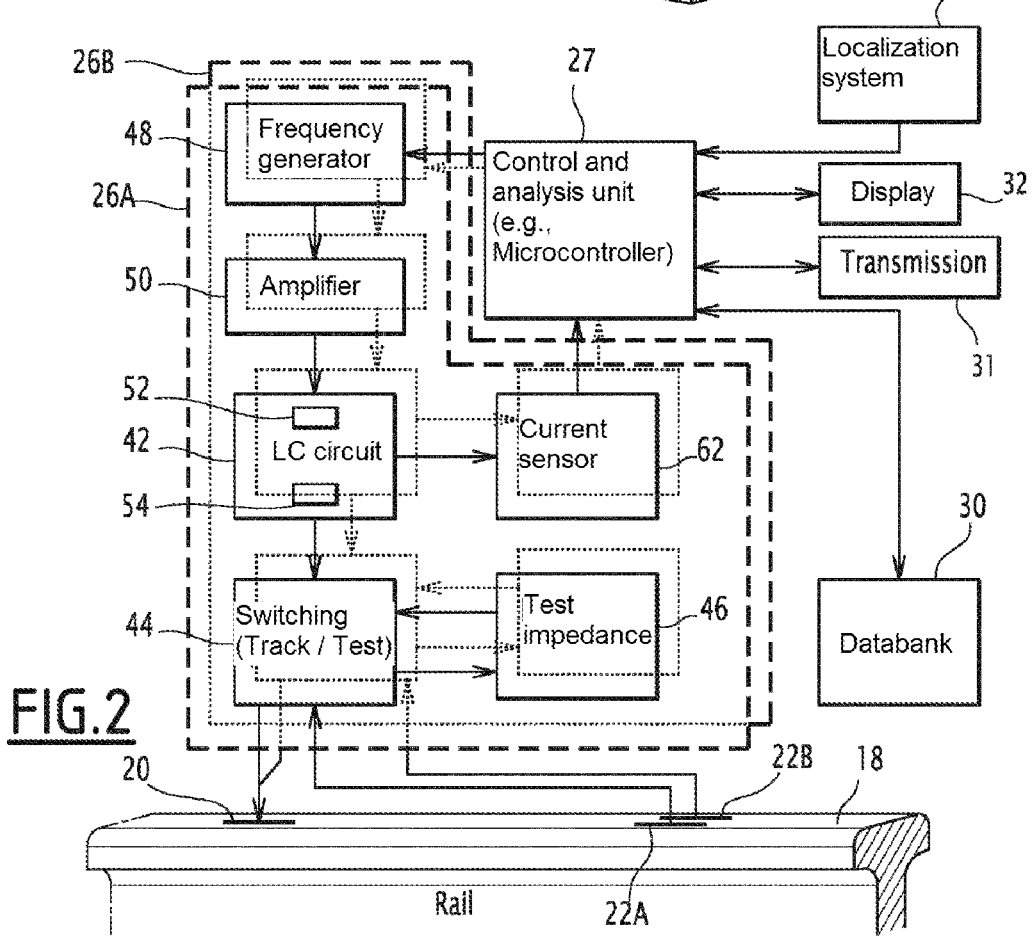
FIG. 2 is a schematic functional view of the rail fault detection device.

The functional diagram of FIG. 2 explains the interaction of the various elements of the electrical detection device 16.

Each processing block 26A, 26B is integrated into a separate measuring circuit comprising the rail 18 and elements of the detection device.

Each measuring circuit forms an RLC circuit that consists of: the reference contact 20, one of the measuring contacts 22A, 22B, the rail segment 18 situated between the reference contact and said measuring contact, an LC circuit denoted 42, comprising an inductance and a capacitance. Each LC circuit 42 increased by the resistance R of the rail 18 is adjusted to be in resonance at the frequency generated by the generator 48.

The processing blocks 26A, 26B have identical structures and only vary by the values of certain components.

For each circuit, the processing blocks 26A, 26B comprise switching means 44 inserted between the reference 20 and measuring contacts 22 and each LC circuit 42. They are able to provide the selective connection of the LC circuit 42 either to the contacts 20, 22A, 22B or to a test impedance 46 of the processing block 26A or 26B. Advantageously, the switching means 44 are an electrical inverter controlled by the user, or programmable to perform a periodic calibration in automatic operation.

Each processing block 26A, 26B comprises a frequency generator 48 connected to the LC circuit 42 through a current amplifier 50 to supply the RLC circuit.

Each frequency generator 48 is able to deliver an alternating current modulated according to a frequency specific to it. The frequencies of the different generators 48 are identical to or different from one another depending on the processing block 26A, 26B.

The current amplifier 50 is able to amplify the electrical current from the frequency generator 48 such that the intensity of this current is adapted to an optical detection.

Each LC circuit 42 comprises a transformer 52 and at least one capacitor 54. Advantageously, the transformer 52 is a 1-to-1 ratio transformer. The inductance of the transformer winding 52 is adjustable by the user of the detection device, as is the capacitance of each capacitor 54.

Each processing block 26A, 26B is connected to the control unit 27 able to control each frequency generator 48. It for example involves a microcontroller.

The frequency of each generator is set under the control of the unit 27 so as, when the LC circuit 42 is connected to the test impedance 46, to be the resonance frequency of each of the resonant RLC circuits thus formed.

Each test impedance 46 is an electric dipole having an electrical impedance strictly equal to the impedance of an inspected rail 18 not having any fault. The test impedance 46 makes it possible to calibrate the adjusting elements of the LC circuit 42, and more particularly the value of the inductance of the transformer 52 and the capacitance of the capacitors 54.

The test impedance 46 is for example an electrical resistance.

It is alternatively shared by several of the processing blocks 26A, 26B.

Each processing block 26A, 26B lastly comprises a current sensor 62 able to measure the amplitude of the sinusoidal alternating current circulating in the resonant RLC circuit formed by the LC circuit 42 and the rail 18 between a pair of associated contacts 20, 22A, 22B, or in the test impedance 46.

The current sensor 62 is for example made using an electrical resistance, across the terminals of which the voltage is measured.

Each current sensor 62 is connected as input to the control unit 27.

The intensity thus measured is representative of the impedance of the circuit that incorporates the rail segment between the two contacts 20 and 22A or 22B. This impedance in turn depends on the presence or absence of a fault on the rail segment. The variation of the impedance of the circuit next makes it possible not only to detect the presence or absence of a fault, but also contributes to its characterization, in combination with the impedances measured by the transversely offset complementary measuring sensors.

The control unit 27 is able to process, at regular sampling intervals, the impedance measurements read by the current sensors 62.

The control unit 27 comprises means for processing the signal to determine, from the amplitude of the currents received over time, and therefore over the advance of the vehicle, whether the analyzed rail portion is faulty, by analyzing impedances measured at each moment on at least two locations on the rail defined by at least two transversely offset measuring sensors 22A, 22B.

The processing of the signal in particular consists of a low-pass filter, for example which allows the frequencies to pass over a band comprised between 1 Hz and 100,000 Hz, and attenuates the others.

Figure 3:
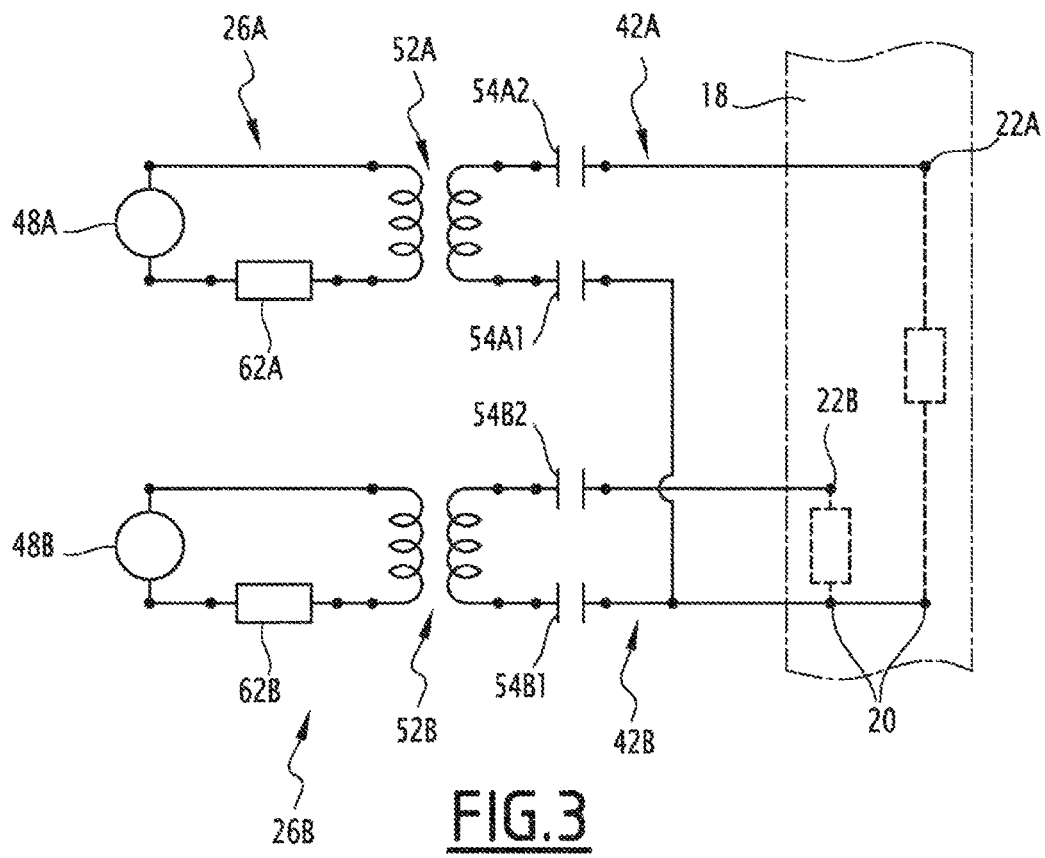
FIG. 3 is a schematic view of the fault detection circuit having two measuring contacts on a rail.

In the embodiment of FIG. 3, the processing blocks 26A, 26B each comprise an LC circuit respectively denoted 42A, 42B each corresponding to a shared reference contact 20 and to a specific measuring contact 22A, 22B. These measuring contacts are each assigned to a processing block 26.

Each LC circuit 42A, 42B comprises its own frequency generator denoted 48A, 48B, respectively, and incorporating an amplifier 50, not shown.

Each frequency generator 48A, 48B is connected to the primary of a transformer denoted 52A, 52B. Measuring resistances, across the terminals of which the voltage is measured, form the current sensors 62A, 62B for each LC circuit 42A, 42B.

Capacitors 54A1, 54A2 and 54B1, 54B2 are arranged between the two terminals of the secondary of the transformer 52A, 52B, respectively, and the reference contact 20, on the one hand, and the corresponding measuring contact 22A, 22B, on the other hand.

Advantageously, a single reference contact 20 is used for both LC circuits 42A, 42B.

In this figure, the impedance of the rail 18 between the contacts 20 on the one hand and 22A and 22B on the other hand is illustrated in dotted lines.

Each generator 48A, 48B generates a sinusoidal signal at a frequency for which the impedance of the RLC circuit is adjusted to its minimum.

Subsequently, when the impedance varies, its transform at primary of the transformer and, consequently, the amplitude of the current at the primary of the circuit also vary. The RMS value is current is measured by the sensors 62A, 62B and thus forms an image of the impedance.

Even if the measuring circuits have a shared point, they are independent. It is therefore possible to generate an identical frequency from both generators 48A, 48B.

This scheme is reproducible over a set of more than two measuring contacts and processing blocks, and not only over two, as shown in the diagram of FIG. 3.

As an alternative to the RMS values, the measuring data are raw data.

Figure 4:
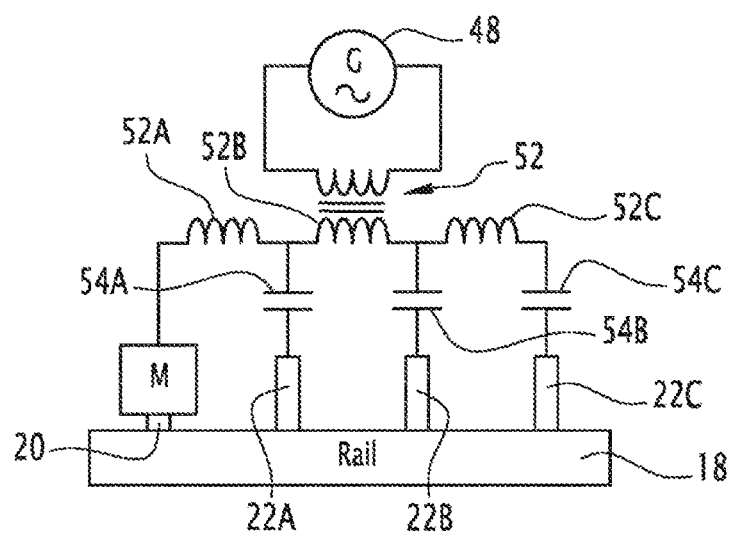
FIG. 4 is an alternative of FIG. 3, using a single frequency generator and three measuring contacts.

According to another embodiment, the device illustrated in FIG. 4 comprises three measuring contacts denoted 22A, 22B, 22C. A capacitor 54A, 54B, 54C, respectively, is connected between each measuring contact 22A, 22B, 22C and to a specific secondary winding denoted 52A, 52B, 52C of a same transformer 52. The reference contact 20 is connected to one end of the secondary winding.

The set of LC circuits thus formed is powered by the generator 48, the terminals of which are connected to the primary of the transformer 52. Each capacitor in series with a secondary winding of the transformer forms a specific LC circuit, the resonance frequency of which with the test resistance 46 (not shown) mounted in series coincides with the frequency generated by the frequency generator 48.

The means for measuring the amplitude of the current in each LC circuit are not shown in this figure.

The analysis of the signal is based on the variations of the impedances revealed by the current circulating in the rail at longitudinally offset points, i.e., the reference contact 20 and the measuring contact 22.

The characterization of the fault results from the combination of the different variations observed between the reference contact 20 and each of the measuring contacts 22A, 22B, 22C, the latter being transversely offset along the width of the rail.

Figure 5:
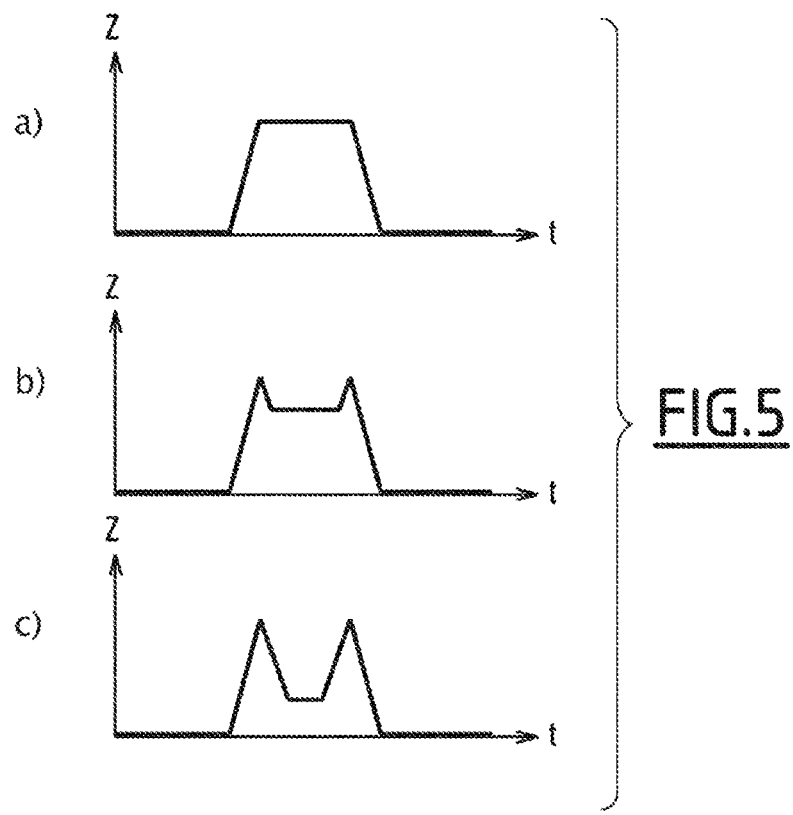
FIG. 5 is a set of three graphs showing the impedance measurement readings of the same fault of a rail from three measuring contacts distributed transversely along the width of the rail.

Impedance variations as a function of time, i.e., the movement of the contacts on the rails, are illustrated in FIG. 5 for three measuring contacts 22A, 22B, 22C transversely offset along the width of the rail, bearing on a same fault. The measuring contacts 22 are assumed to be positioned in locations distributed along the width of the rail.

The software for characterizing faults is programmed so as to differentiate between whether the signatures a), b) and c) correspond to a single and same fault, or if there are adjacent faults, distributed transversely over the rail in the same location.

Preferably, the memory 30 contains prerecorded signatures for different types of rail faults and the control unit 27 is able to compare the impedance profiles read from several transversely offset measuring contacts to the prerecorded signatures to determine the likely type of fault, as well as its size.

The signatures stored in the memory 30 each contain several profiles, corresponding to all of the measurements obtained from each of the transversely offset measuring contacts for a same fault.

Thus, since the appearance of the read impedance curves is specific to each fault, the detection technique using impedance measurement of a rail makes it possible to precisely determine the characteristics of a fault, such as its type, shape or size.

Generally, the more regular the surface of the rail is, the lower the impedance is. An increased impedance reflects a discontinuity or a fault on the surface of the rail.

In case of surface faults, when one or the other of the measuring contacts passes over the surface faults, the quality of the electrical contact decreases and the impedance increases.

The profiles 5a, 5b and 5c of FIG. 5 correspond to each of the readings of each of the three measuring contacts 22A, 22B and 22C, respectively, bearing on a same fault located on all or part of the rail surface of the rail. In the illustrated case, the fault is very pronounced in the passage location of the sensor 22A (5a), and increasingly attenuated in the passage location of the sensors 22B (5b) and 22C (5c). The fault therefore extends from the passage locations of the contact 22A, lessening up to 22C, which makes it possible to deduce its size and shape.

In another example that is not shown, if all three contacts 22A, 22B and 22C were to cover the entire surface of the rail, and had the same signature corresponding to the profile 5a at the same moment T for the same rail portion and therefore pertaining to a same fault, a clean fracture of the rail would be deduced therefrom.

The knowledge of the fault, in several locations of the section of the rail, makes it possible to determine the size and shape as well as the exact nature of the fault. Indeed, for each location in the section of the rail, the span of the fault is measured along its length over the rail, and its depth can be estimated as a function of the variation of the impedances. The existence of several measurements located transversely over the rail over a same fault makes it possible to obtain information on the nature of the fault, and thus to characterize it, whereas a single measuring contact only makes it possible to detect the presence of the fault (with no additional information), and may not even detect a fault if the passage location of the single contact is next to the fault.

The geolocation module 28 is able to locate the railway vehicle 10 at any moment on the railway track. The geolocation module 28 is for example made using a GPS system and/or a beacon detector for beacons situated at regular intervals along the railway track, and the odometer system of the train 10. The odometer system further provides the speed of the train, which is necessary to calculate the length and shape of the rail fault based on the duration of the disruption of the impedance represented by profiles of the type of profiles 5a to 5c, while the train is moving forward. It is connected to the control unit 27 to allow localization and characterization of each measurement done.

The control unit 27 is able, when the fault is identified, to perform a time correlation between the geolocation data from the geolocation module 28 and the values from the downstream processing block 26A, 26B, etc. This control unit 27 is formed by a computer unit, for example a portable computer or electronic cabinet, with appropriate software. It is capable of continuously performing filtering, post-processing comprising integrating data supplied by the various measuring circuits resulting in the characterization of the fault, in particular its size and volume.

A databank 30 is connected to the control unit 27. It contains the elements necessary for the control unit 27 to perform the fault characterization operation. It also stores the results of the processing operations of the control unit 27 as they are produced.

Alternatively, the control unit 27 is able to generate an alarm in real time if a predefined severity threshold of the faults is exceeded on one or several results.

Advantageously, the alarm comprises several severity thresholds, for example defining rail faults to be inspected in more detail, rail faults to be repaired within a given period, for example within forty-eight hours or twenty-four hours, or rail faults requiring a speed reduction by trains, or discontinued use.

The control unit 27 is interfaced with a transmission unit 31 that sends this characterization information for the detected faults to a fixed establishment, the transmission being able to be done in real time or on a deferred basis.

Alternatively, the control unit 27 is interfaced with an on-board display unit 32 allowing staff to familiarize themselves with the characterization of the detected faults.

The detection device by impedance measurement is on-board a train, and this train is circulating on a line based on the preventive maintenance strategy. The number of trains equipped and the measured frequency will be established as a function of the requirements of the maintenance strategy, the latter being subject, inter alia, to the operating program (intensity of traffic and load of the trains), the types of rail (a light rail may be overstressed by repeated exceptional traffic), and the distribution between preventive and corrective maintenance decided on by the maintenance operator.

Figure 6:
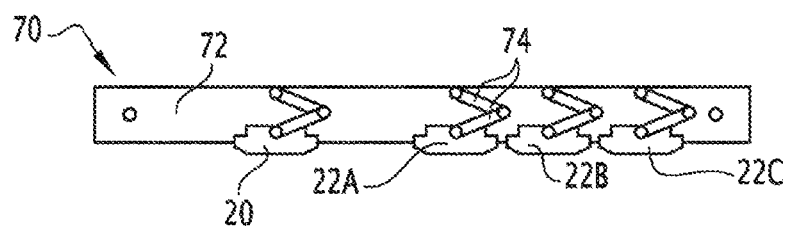
FIGS. 6 and 7 are schematic side views of two embodiments of a measuring box comprising several movable measuring contacts bearing on offset points of the section of the rail.

For the implementation of the reference 20 and measuring contacts 22A, 22B, 22C, these are advantageously carried in a box 70 in the form of a beam 72 on which the contacts are articulated as illustrated in FIG. 6.

The contacts are electrically isolated from one another and from the beam 72.

In this embodiment, a single reference contact 20 is mounted at one end of the box 70. It bears on the entire width of the rail. The box 70 comprises several measuring contacts 22A, 22B, 22C, here three, arranged successively and bearing on different transverse pads on the surface of the rail. For example, the contact 22A bears on the median part of the rail, the contact 22C on the inner throat of the rail and the contact 22B between the two contacts 22A and 22B along the width of the rail.

The box 70 is advantageously suspended from the axle boxes of a bogie by articulated arms and adjustable suspension means. Thus, the compensation for the travel of the primary suspension of the bogie is unnecessary and the box 70 remains at a substantially constant distance from the surface of the rail. Stop abutments of the box 70 are advantageously provided between the bogie and the box to provide guidance thereof.

The successive contacts are preferably mounted articulated relative to the beam 72 to be applied correctly to the rail. This mounting is for example done by a set of connecting rods 74 forming a pantograph for each contact. Preferably, the contacts are kept in contact with the rail by elastic means arranged between each contact and the box 70.

In the embodiment of FIG. 7, the contacts 20, 22A, 22B and 22C are mounted translatably relative to the box in the plane of the section of the rail. They are guided in translation in a sheath 76. A spring 78 is inserted between each contact and the beam 72 to stress the moving contact against the rail.

In the embodiment of FIGS. 8 to 10, the contact surface of each pad is perpendicular to the movement axis of the pad in the sheath 76. Based on the nominal shape of the rail, and based on the transverse position of the contact with respect to the rail, the angle measured relative to the vertical of the sliding axis of the contact relative to the box is variable. It is higher when the contact is close to the flank of the rail.

In the embodiment of FIGS. 11 to 13, the movement axis is identical for all of the contacts, but the surface of each pad has its own incline relative to the horizontal. The angle of each contact surface relative to the horizontal is larger when the contact is close to the flank of the rail.

Alternatively, both the sliding axes and the inclines of the contact surfaces relative to the sliding axes are separate from one contact to the next depending on the position of the contact in the width of the rail.

The contacts are advantageously beveled at their front and rear ends in light of the direction of advance of the vehicle to be able to pass switches and other track devices without catching on them.

As illustrated in FIG. 14, each contact advantageously comprises an electrically conductive metal core 80 in contact with the rail and a lateral coating 82 made from an insulating material in which the core is housed while being flush with the lower surface in contact with the rail. The coating 82 is advantageously ski-shaped with two end tips. Alternatively, it is simply beveled. This solution has the additional advantage of allowing small enough contact not to shunt small rail faults. The contact surface of the core with the rail is then comprised between 0.05 cm$^2$ and 2 cm$^2$.

In the embodiment of FIG. 15, a pad, denoted 84, applied on the rail carries several adjacent measuring contacts 22A, 22B, 22C, 22D arranged in a same plane transverse to the rail. These contacts are connected to one another to form an articulated chain 86, retained at its ends to its support 88 maintained across from the upper surface of the rail and applied on the rail by a vertical elastic force. This chain extends transversely to the primary direction of the rail forming the measuring direction. The contacts are electrically isolated from one another at the articulations provided between them. The chain marries the shape of the rail when the contacts are pressed against the rail.

In this embodiment, in particular, the support 88 advantageously comprises a bevel 90 illustrated in FIG. 15 capable of bearing on the throat of the rail, and being maintained there by an elastic member applying a substantially horizontal pressure force on the support to keep the bevel 90 against the throat in addition to the vertical force applied on the support.

Irrespective of the embodiment, the length of the pad corresponds to the largest frog gap to be crossed. For example, for a collector shoe applied horizontally on the rail, the length of the pad will thus be about 850 mm, including bevels, in the example of a high-capacity subway. This length is preferably comprised between 700 mm and 1000 mm.

Bevels are arranged at the ends of the pad to approach the rail faults as well as the track devices. Furthermore, these bevels have a deflector shape to return any grease of the rail downward, avoiding rising of the grease that would affect the braking capacity of the train.

FIG. 16 shows an example assembly of a single pad denoted 100 on a platen 101 for fastening to the beam of the structure of a bogie.

The pad is retained by two adjacent deformable parallelograms 102 made up of connecting rods 104 assembled to guide the pad 100 on the rail, offsetting the travel of the primary suspension of the bogie.

This arrangement is preferably provided below each of the two beams of the bogie, which corresponds to a device on each side to detect the faults of the two rails of the track.

The two parallelograms 102 are secured on one side on the bogie and on the other side on a platen 103 carrying the pad 100. The parallelograms 102 extend in planes perpendicular to the rail.

A jack 106 is provided at the guide connecting rods. It is inserted between the pad 100 and platen 101 secured to the bogie. This jack 106 acts vertically on the pad in addition to its own weight to press the pad against the surface of the rail.

The platen 103 is kept parallel to the upper surface of the rail. The pad 100 is mounted sliding below the platen 103 by guideways 110 positioned perpendicular to the pad length in the plane of the pad 103. Elastic members 112 inserted between the platen 103 and the pad 100 ensure a transverse application of the pad against the throat of the rail, such that the bevel 90 forming a transverse bearing surface is kept against the throat of the rail.

As shown in FIG. 17, the pad comprises a single reference contact formed by a removable end-piece 120 provided at the head of the pad. This end-piece bears on the surface of the rail over the entire width thereof. This reference contact is advantageously duplicated by using the second end-piece 121 of the collector shoe.

Alternatively, the reference contact is formed by the median surface itself of the pad denoted 122, which is kept in contact with the rail. The measuring contacts 22 are isolated from the reference contact.

A large number of measuring contacts 22, here 18 and preferably with a number comprised between 10 and 30, are positioned along the width of the pad. They are each independent and elastically pressed on the rail from the support of the pad. They each have a bevel to be capable of passing over the faults without risk of being sheared (bevels not shown) and are electrically isolated from one another and from the body of the pad.

These contacts are offset relative to one another longitudinally and transversely to form an alignment covering the head of the rail.

FIG. 18 illustrates a same pad 100 with another design with contacts in several different positions when crossing a shoulder between two successive rails.

This pad comprises several adjacent blades 132, each forming a contact 22A, 22B, 22C, etc. The sliding of these blades relative to one another is guided while they are kept in contact against one another. They are electrically isolated from one another by an isolating coating. A front and rear guide block ensures that the imperfections and faults of the rail are correctly approached by the blades; in the present example, these blocks also serve as reference contacts 20 (duplicated).

The blades slide vertically and are retained together and with the guide blocks by one or several strands 134 of elastomeric material longitudinally traversing the stack of adjacent blades.

Each blade comprises, across from the surface of the rail, a protuberance able to bear on the surface of the rail. The protuberances provide the electrical contacts with the rail. These protuberances are in different locations along the width of the rail for all of the blades.

The strand 134 provides mutual driving of the adjacent blades so as not to catch on rail faults and to cross any irregularities in the rail. Contrary to the previous embodiment, beveling all of the contacts is not necessary; in this embodiment, only the guide blocks 136 and the blades situated at the ends are beveled.

The present invention allows rail fault detection by the operating vehicles during their normal operation.

Alternatively, the device is secured to a railway vehicle specifically dedicated to that purpose, not intended to transport people or goods. It comprises a self-propelled wagon capable of traveling autonomously along the track by bearing on a single rail or both rails.

This wagon is for example remotely controlled or comprises means for programming its autonomous movement. Together with the measuring device, it forms a measuring machine capable of examining the track.

The invention claimed is:

1. An electrical detection device intended to be carried by a rail vehicle traveling on rails constituting a railway track and making it possible to detect faults in at least one rail, said electrical detection device comprising:
    at least one reference contact and at least two corresponding measuring contacts suitable for being applied to a rail, wherein said at least two measuring contacts are transversely offset relative to a measurement direction corresponding to the axis of the rail;
    a contact support mechanically linked to the rail vehicle facing the surface of the rail in the measurement direction, carrying said at least one reference contact and said at least two corresponding measuring contacts, such that the or each said reference contact and the or each said corresponding measuring contacts relate to the same and
    a processing circuit to which the or each reference contact and the or each corresponding measuring contacts are connected, measuring the impedance between the corresponding reference and measuring contacts.

2. The electrical detection device according to claim 1, comprising means for applying reference and measuring contacts on the rail according to different application angles from one another in the plane transverse to the length of the rail.

3. The electrical detection device according to claim 1, wherein said contact support presses on the surface of the rail and carries several references and measuring contacts electrically isolated from one another and elastically charged away from the contact support carrying each reference and measuring contact.

4. The electrical detection device according to claim 3, wherein said reference and measuring contacts of a same contact support are connected to one another to form an articulated chain, retained at its ends to the contact support and extending transversely to the measuring direction.

5. The electrical detection device according to claim 3, comprising several adjacent strips isolated from one another, each forming a reference or measuring contact, said strips being guided to slide relative to one another.

6. The electrical detection device according to claim 3, wherein said contact support comprises a bearing surface on a lateral flank of the rail, the device, further comprising lateral stressors of the contact support to keep the hearing surface in contact with the lateral flank of the rail.

7. The electrical detection device according to claim 1, comprising:
    a system for locating the rail vehicle; and
    correlator correlating measurements with the position of the vehicle at the time of the measurement.

8. The electrical detection device according to claim 1, comprising a fault detector detecting faults from at least two impedance characteristics measured by said at least two measuring contacts.

9. The electrical detection device according to claim 1, wherein the or each reference and measuring contact comprises a beveled shape at each of its ends.

10. A rail vehicle, comprising:
    wheels capable of rolling on the railway track; and
    the electrical detection device according to claim 1,
    wherein the or each said corresponding reference and/or measuring contacts are arranged between two immediately successive wheels supporting the railway vehicle.

11. A measuring machine, comprising:
    an automated and/or remotely controlled self-propelled wagon able to follow at least one line of rails; and
    the electrical detection device according to claim 1, secured to said self-propelled wagon.

* * * * *